(12) United States Patent
Muñoz et al.

(10) Patent No.: US 6,486,806 B1
(45) Date of Patent: Nov. 26, 2002

(54) SYSTEMS AND METHODS FOR ADAPTIVE AUTO-CALIBRATION OF RADIX<2 A/D SAR CONVERTERS WITH INTERNALLY GENERATED STIMULI

(75) Inventors: Carlos Esteban Muñoz, Austin; Karl Ernesto Thompson, Converse; Douglas S. Piasecki; Wai Laing Lee, both of Austin; Eric Swanson, Buda, all of TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/393,828

(22) Filed: Sep. 9, 1999

(51) Int. Cl.[7] ............................................. H03M 1/10
(52) U.S. Cl. ........................ 341/120; 341/144; 341/118
(58) Field of Search ................................. 341/143, 144, 341/120, 118; 702/107

(56) References Cited

U.S. PATENT DOCUMENTS 5,668,549 A * 9/1997 Opris ........................... 341/118
6,130,632 A * 10/2000 Opris ........................... 341/120
6,154,162 A * 11/2000 Watson et al. ............... 341/150

* cited by examiner

Primary Examiner—Peguy JeanPierre
(74) Attorney, Agent, or Firm—Dan A. Shifrin, Esq.

(57) ABSTRACT

An auto-calibrating companion bit successive approximation system uses sampling and balancing capacitors in a charge redistribution digital-to-analog converter having multi-valued capacitors of magnitudes enabling redundant expression of electric charge values. Companion bits are used with sets of balancing capacitors for successive approximation of sampling voltages. A charge redistribution digital-to-analog converter has a sampling and balancing capacitors including associated companion bit capacitors represented by digital weights which are saved in memory. A non-binary weighted set of capacitors provides redundancy in a charge redistribution digital-to-analog converter employed in a successive approximation register architecture.

24 Claims, 12 Drawing Sheets

SYSTEMS AND METHODS FOR ADAPTIVE AUTO-CALIBRATION OF RADIX<2 A/D SAR CONVERTERS WITH INTERNALLY GENERATED STIMULI

CROSS-REFERENCE TO RELATED APPLICATIONS

This application is related to the following patent applications which are expressly referred to and incorporated herein in their entirety: (1) "Precision Voltage Source Systems and Methods for Digital Calibration of Successive Approximation Analog-to-Digital Systems" invented by Carlos Esteban Munoz, Karl Ernesto Thompson, Douglas S. Piasecki, Wai Laing Lee, and Eric Swanson; U.S. patent application Ser. No. 09/393,079, filed on even date herewith; (2) "Selection and Use of Bit Testing Sequences for Radix<A/D SAR Converters" invented by Carlos Esteban Munoz, Karl Ernesto Thompson, Douglas S. Piasecki, Wai Laing Lee, and Eric Swanson; U.S. patent application Ser. No. 09/393,091, filed on even date herewith; (3) "Successive Approximation Algorithm-Based Architectures and Systems" invented by Carlos Esteban Munoz, Karl Ernesto Thompson, Douglas S. Piasecki, Wai Laing Lee, and Eric Swanson; U.S. patent application Ser. No. 09/393,093, filed on even date herewith; (4) "Successive Approximation Architectures and Systems" invented by Carlos Esteban Munoz, Karl Ernesto Thompson, Douglas S. Piasecki, Wai Laing Lee, and Eric Swanson; U.S. patent application Ser. No. 09/393,826, filed on even date herewith; (5) "Methods and Systems for Calibration and Conversion in an A/D SAR System including Digital Weight Storage and Accumulation" invented by Carlos Esteban Munoz, Karl Ernesto Thompson, Douglas S. Piasecki, Wai Laing Lee, and Eric Swanson; U.S. patent application Ser. No. 09/394,809, filed on even date herewith; (6) "Redundancy Methods and Systems Calibration and Conversion with DAC Elements in an ADC" invented by Carlos Esteban Munoz, Karl Ernesto Thompson, Douglas S. Piasecki, Wai Laing Lee, and Eric Swanson; U.S. patent application Ser. No. 09/393,046, filed on even date herewith; (7) "Calibrated Quasi-Autozeroed Comparator Systems and Methods" invented by Karl Ernesto Thompson, Carlos Esteban Munoz, Douglas S. Piasecki, Wai Laing Lee, and Eric Swanson; U.S. Pat. No. 6,252,454, filed on even date herewith and issued Jun. 26, 2001.

BACKGROUND OF THE INVENTION

1. Field of the Invention

The present invention relates to adaptive calibration of capacitor values in a successive approximation analog-to-digital converter having a radix weighted multi-capacitor charge redistribution digital-to-analog converter (CRDAC), and more particularly to adaptive calibration of the capacitor values in the CRDAC, and systems and methods for adaptive, self-stimulated autocalibration in connection with digital-to-analog converter (DAC) auto-measurement in analog-to-digital (A/D) converters.

2. Description of the Related Art

One attempt to design a calibrated successive approximation architecture is described in David R. Welland's U.S. Pat. No. 4,709,225 (granted in 1987). Binary weighting after wafer fabrication is set forth in the patent according to the Welland approach, which includes adjusting an array of capacitors scaled according to a radix 2 (i.e., binary) function, resulting in non-overlap.

Related art U.S. Pat. No. 4,336,526 granted to Basil Weir describes successive approximation analog-to-digital conversion (ADC) using a radix less than two weighted digital-to-analog converter (DAC) in a feedback loop using a comparator and a successive approximation register (SAR) logic circuit to solve the binary non-overlap problem. A proposed conversion operation produces a digital output representative of an unknown analog input. A DAC accepts a digital word comprising a sequence of series bits, to produce a corresponding analog voltage value. An impedance network is described including capacitors, for example, which have sequential capacitance values which are a function of radix less than two. Costly and complicated switching circuits precisely represent accurate series weights in such an impedance network. A first analog cancellation voltage is produced in the DAC with a selected most significant bit (MSB) capacitance. The first analog cancellation voltage is input to a comparator to set-off a received analog voltage which is to be converted into digital form by SAR conversion. If the first analog cancellation voltage from the MSB is insufficient to cancel out the received analog voltage under conversion, as evidenced by the sign of the output value from the comparator, then the tested MSB is kept. Unfortunately, Weir does not show or suggest adaptive calibration.

In a binary sequence network, the MSB capacitance in a selected impedance network of n capacitors slightly exceeds the sum of the remaining totality of less significant capacitances. Accordingly, if by virtue of noise or some other ancillary effect, a MSB is erroneously kept, then not even summing all the contributions from the remaining less significant capacitances will result in an approximation which has a cumulative value greater than the most significant capacitance. In other words, the use of radix 2 for successive approximation according to the prior art is technically disadvantageous, because for radix 2, there is no recovery from an erroneous (e.g., noise-induced) approximation with a particular most significant value bit, because the sum of the less significant bit capacitances or voltage figures does not reach either singly or cumulatively to the magnitude of the single erroneously kept voltage or capacitance level. Simply stated, with a radix 2 series, there is no redundancy which permits alternative expressions of particular voltage or capacitance levels.

SUMMARY OF THE INVENTION

According to the present invention, a system for adaptive auto-calibration of radix<2 A/D SAR converters with internally generated stimuli, includes a plurality of DAC elements having element values ratioed by radix<2 with respect to at least one other element, the values of said plurality of DAC elements being subject to calibration. The system further includes a memory for storing digital DAC element values; and a controller for determining values of said plurality of DAC elements for storage in said memory, based upon calibration operation using said DAC elements, and performing conversion of analog voltages into digital counterpart values, during conversion operation using calibration values of the DAC elements established during calibration and stored in the memory.

According to one embodiment of the present invention, a physically fixed set of capacitances is contructed as a tapered array for use without trimming or electronic adjustment, and a memory is trained to incrementally converge corresponding digital weights corresponding to the actual physical values of the constructed set of capacitances, permitting determination of unknown analog voltages by approximation with the constructed capacitances as reflected in corresponding digital weight values. According to the present invention, instead of physically or electrically adapting a constructed capacitor array, to establish a precise radix 2 tapered capacitor array, a digital weight array of values is constructed in register memory locations which is respectively representative of the actual constructed capacitor array values. This reduces manufacturing costs, because no precise capacitor array needs to be constructed. Instead, the actual capacitance ratios of a roughly constructed, non-precision capacitor array, are determined and stored in memory, to enable precise analog-to-digital conversion with an array of capacitors which are not precisely ratioed according to a predetermined radix value distribution.

According to one embodiment of the present invention, adaptive calibration of a charge redistribution digital-to-analog converter includes producing a set of sampling bits to connect sampling components such as capacitors or resistors to a selected reference voltage. Different sets of sampling bits are used to cover a selected calibration range, with the sampling sets being predetermined, fixed, random, or pseudo-random. Each set of sampling bits produces a corresponding sampled value. The sampled value is approximated with successive balancing values produced with corresponding sets of balancing bits. An analog residue is produced from the difference between the sampled and balancing values. Digital weights are generated corresponding to the sampling and balancing bits. A digital residue is determined from the difference between the sampling and balancing digital weights. The charge redistribution digital-to-analog converter includes a set of multi-valued components which can redundantly approximate particular sampled values. According to one embodiment of the present invention, the set of components includes capacitors which can be organized into subsets of capacitance values which can redundantly approximate desired capacitance values within a predetermined range.

According to the present invention, adaptive calibration is accomplished without an external impulse by a non-binary companion bit charge redistribution digital-to-analog SAR converter. Companion bits are selected lower significance bits used with associated test bits to choose particular capacitors during SAR processing and having a predetermined magnitude relationship with the test bits. Conversion of SAR capacitors according to the present invention includes balancing a sampled charge with a group of capacitors having capacitance values scaled according to a radix less-than-two function and including companion bit capacitors.

BRIEF DESCRIPTION OF THE DRAWINGS

FIG. 6F is a diagram of a charge redistribution system which is approximating an input voltage with a test voltage equal to a reference voltage times the ratio of a sum of fifth, third, and zeroth capacitances over the total bank capacitance;

DETAILED DESCRIPTION OF THE PREFERRED EMBODIMENTS

Figure 1A:
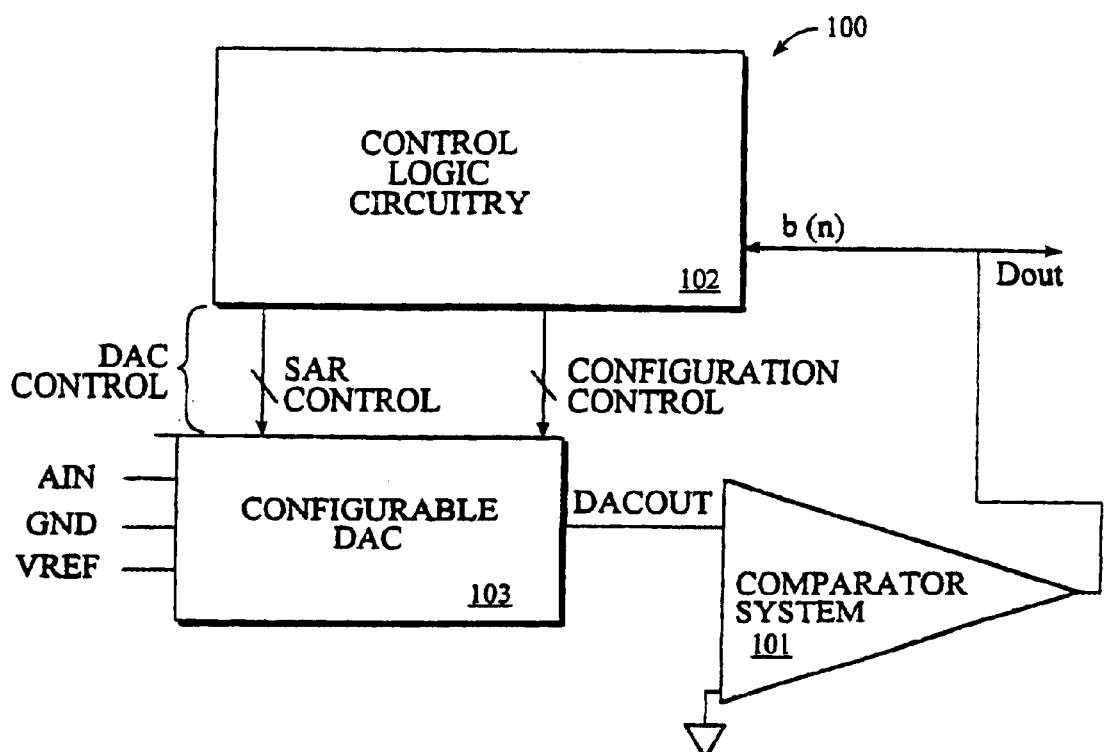
FIG. 1A is a block diagram of an adaptive calibration converter system according to the prior art.

Referring now to FIG. 1A, there is shown a block diagram of an successive approximation converter system 100 according to the prior art. In particular, the converter system 100 includes a comparator system 101, control logic circuitry 102 connected to comparator 101, and a configurable charge redistribution digital-to-analog converter (i.e., configurable DAC) 103 connected to the comparator system 101 and the control logic circuitry 102. The configurable DAC 103 is connected to the comparator system 101 with a DACOUT line. An output connection of the comparator system 101 produces a bit stream b(n) and an output signal, DOUT. The control logic circuitry 102 is connected to the configurable DAC 103 with DAC control signals including SAR control signals and configuration control signals. The configurable DAC 103 is provided with inputs AIN, GND, and VREF.

Figure 1B:
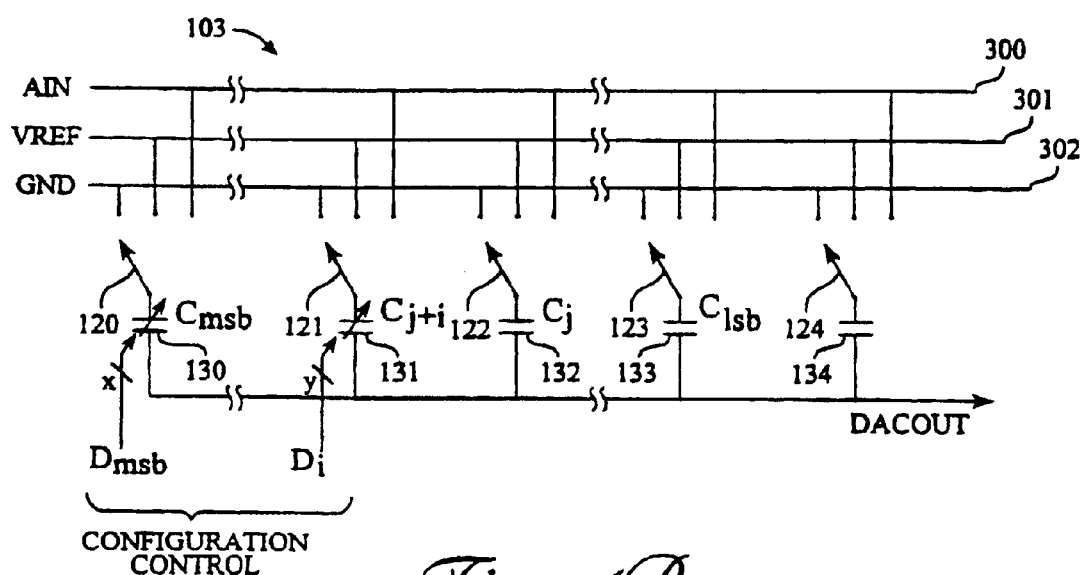
FIG. 1B is a block diagram of a variable capacitance charge redistribution system according to the prior art in which radix two precision is ensured by capacitor adjustment selecting particular combinations of capacitances to overcome imprecise fabrication, according to the prior art.

Referring now to FIG. 1B, there is shown a block diagram of a configurable DAC 103 according to the prior art in which radix two precision is ensured by capacitor adjustment selecting particular combinations of capacitances to overcome imprecise fabrication. In particular, the configurable DAC 103 includes input lines for AIN, VREF, and GND, respectively 300, 301, and 302. The configurable DAC 103 further includes a bank of switches respectively switches 120–124, and a capacitor bank including capacitors Cmsb, Cj+1, Cj, Clsb, and Cd, respectively capacitors 130–134. Switches 120–124 are connected to respective ones of capacitors 130–134. Configuration control is obtained by use of configuration control signals Dmsb through Di, which are used to adjust the specific capacitance levels of capacitors Cj+1 through Cmsb. Accordingly, radix two precision is achieved by adjusting capacitor values after fabrication. This is expensive and undesirable.

Figure 1C:
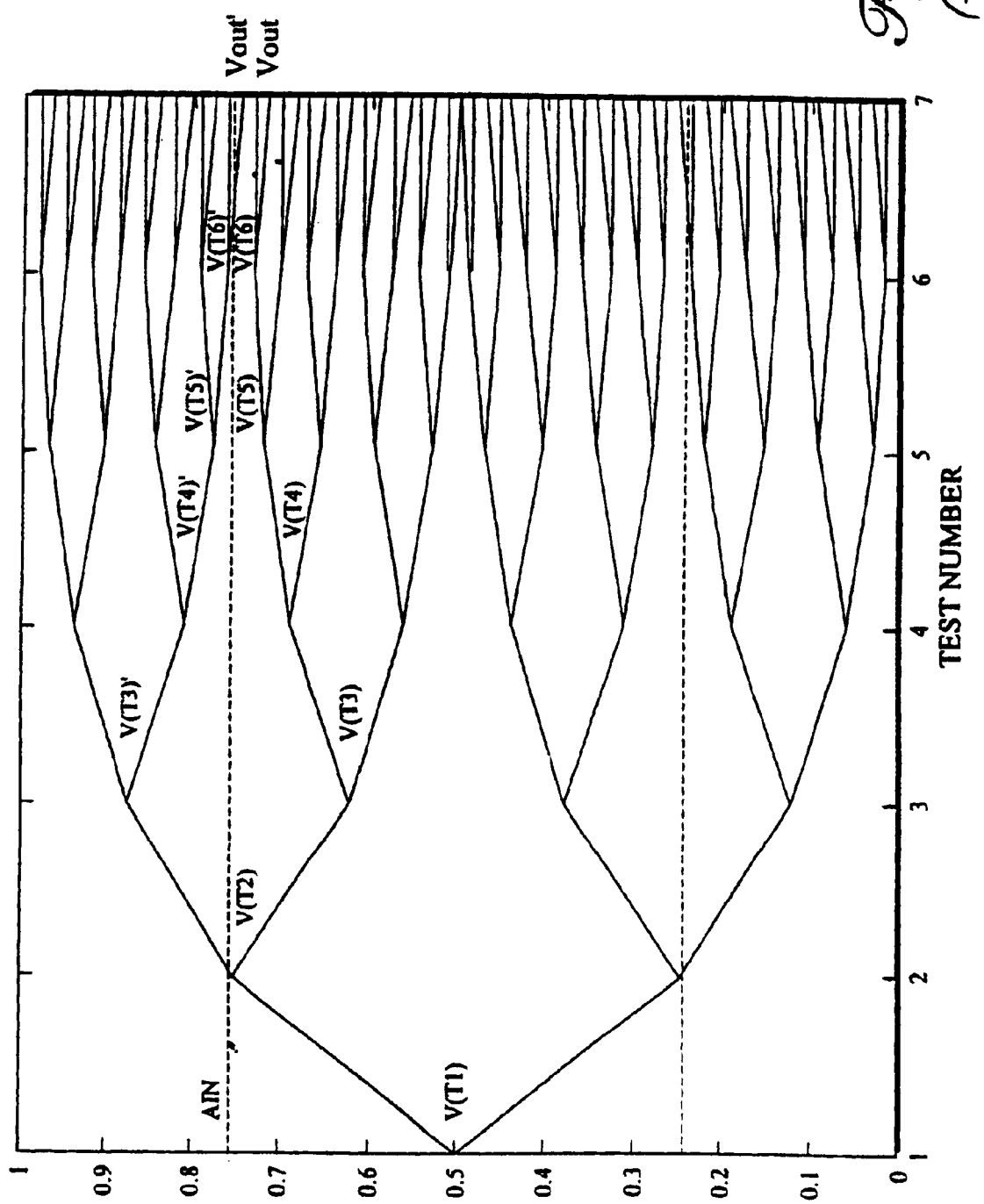
FIG. 1C is a graph of a generalized decision tree for a successive approximation method according to the prior art.

Referring now to FIG. 1C, there is shown graph of a generalized decision tree for a successive approximation method according to the prior art. In particular, FIG. 1C shows a generalized radix two decision tree for successive approximation method (SAR), which does not show overlapping paths in determining approximate values resulting in a gap between alternate approximation values in the event of an erroneous, for example noise-induced approximation step. In general, the maximum input voltage level VIN or AIN which can be approximated is no greater than VREF, the reference voltage provided to a SAR converter system. During calibration, a random sequence of input voltages is approximated to develop a relationship between input voltages and digital weights. During post-calibration operation (i.e., normal measurement operation), an arbitrary input voltage will be subject to successive approximation. The decision tree shown in the Figure is disclosed to the extent of the first six steps of an approximation. During a first test or attempt at approximation according to the present invention, a most significant bit (MSB) and associated companion bits are used to select balancing capacitors in a capacitor array to produce a first test voltage VT1, which in this instances is less than the input voltage VIN which is being approximated. Accordingly, the MSB in this first step of approximation is kept and represented by a one "1" in the region above the graph extending between n=0 and n=1. The next approximation step includes balancing capacitors identified by two most significant bits (i.e., "11" and companion bits which are associated with the second of the two most significant bits). The second step of approximation is made with a cumulative test balancing voltage VT2'=VT1+VT2, where VT2 is the voltage associated with the second most significant bit and its predetermined companion bits. VT2' is the cumulative voltage associated with the first and second MSBs and only the companion bits associated with the second MSB. If VT2' is subject to noise in an amount that the resultant exceeds VIN, the second most significant bit is not kept, and there accordingly will be a "0" in the region above the graph which extends between n=1 and n=2. This is erroneous, as VT2' is actually less than VIN, and there should actually be a 1, for keep, in the indicated region. The corrected erroneous results are thus expressed as a 1/0 for should keep but not kept if sufficient noise. Similarly, when a third cumulative test voltage VT3' is applied. The cumulative test voltage exceeds VIN, causing the third most significant bit not to be kept. If the second bit has not been kept, the third most significant bit is kept, as represented by VT3. Thus, the correct and erroneous results are expressed for the third most significant bit as 0/1 for not keep and keep respectively. But the fourth cumulative test voltage is less than VIN for both paths, causing the fourth MSB to be kept as expressed by 1/1. The fifth MSB is also kept (1/1), as is the sixth (1/1). In each case, a digital word is applied to generate the particular analog test voltage or cumulative test voltage which is produced for cancelling out VIN. However, the radix two decision tree results in no path convergence as a result of lack of redundancy. Analog test values are compared to a sampled analog input VIN using successively more complete significant kept bit values and companion bits associated with the least significant of the most significant kept bits, i.e., the last test bit. If the output of the comparator is high pursuant to comparison, then the tested most significant bit is kept and the bit is set equal to 1. If the comparator output is low, the tested MSB of the latest successive approximation round is set equal to 0. The process continues in this manner until all bits of an approximating digital word have been established as kept or not by successive approximation. The successive-approximation sequence according to the prior art fails in converging to the sampled analog input.

Figure 2:
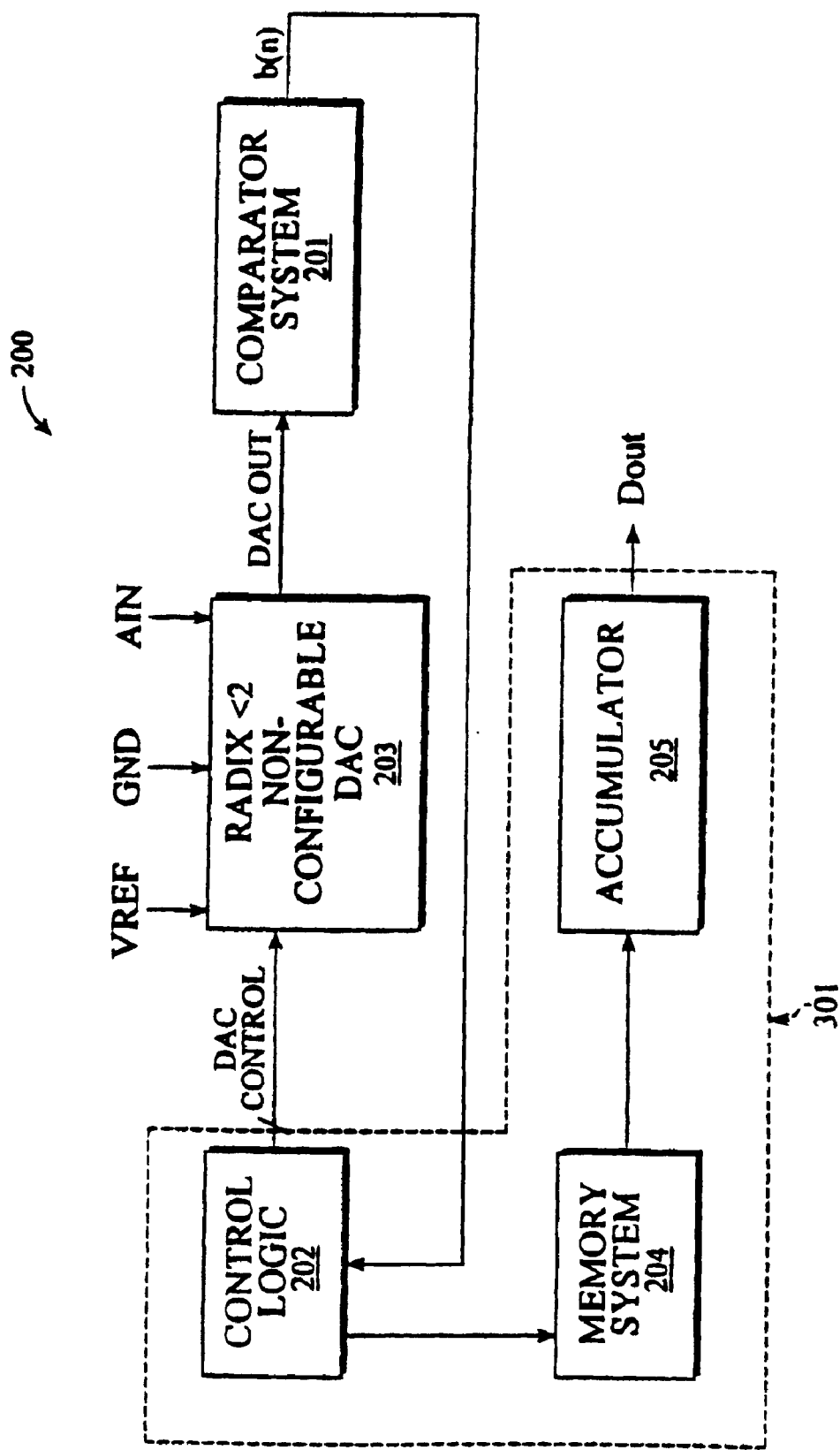
FIG. 2 is a block diagram of a companion bit successive approximation system which can be used according to one embodiment of the present invention.

Referring now to FIG. 2, there is shown a block diagram of an successive approximation converter system 200 according to the present invention. In particular, the converter system 200 includes a comparator system 101 having first and second inputs receiving respective reference (REF) and digital-to-analog converter (DAC) outputs. The converter system 200 further includes a radix-less-than-two non-configurable DAC 203 and a computational engine 301 according to one embodiment of the present invention. The radix-less-than-two non-configurable DAC 203 is configured to produce DAC control signals according to one embodiment of the present invention, and to produce output values Dout in response to input signals VREF, GND, AND AIN received by the radix-less-than-two non-configurable DAC 203 The computational engine 301 includes control logic circuitry 202, memory system 204 connected to control logic circuitry 202, and accumulator 205. One input of comparator 101 is connected to radix-less-than-two non-configurable DAC 203, to enable receipt of an output signal. Another input of comparator 101 is connected to radix-less-than-two non-configurable DAC 203, to enable receipt of an input reference signal. The comparator system 101 produces an output binary signal set b(n). The control logic circuitry 202 stores values in memory system 204 and produces DAC control signals for radix-less-than-two non-configurable DAC 203. The accumulator 205 is connected to memory system 204 for receiving memory information for accumulation and to produce an output signal Dout in response to input signals VREF, GND, and AIN.

Figure 3A:
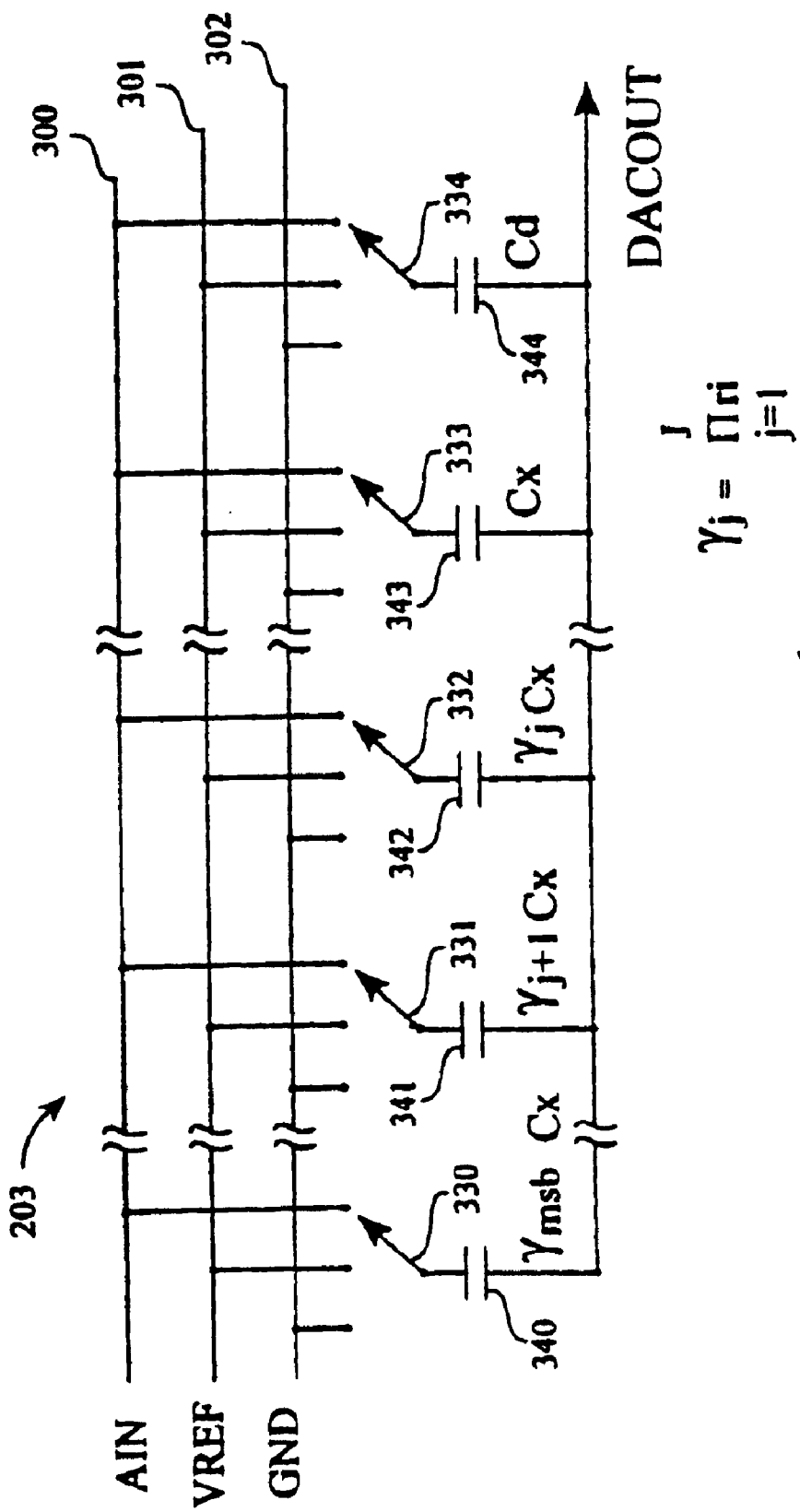
FIG. 3A is a block diagram of a charge redistribution system including a bank of radix less-than-two capacitors for adaptive calibration in connection with present invention.
Figure 3B:
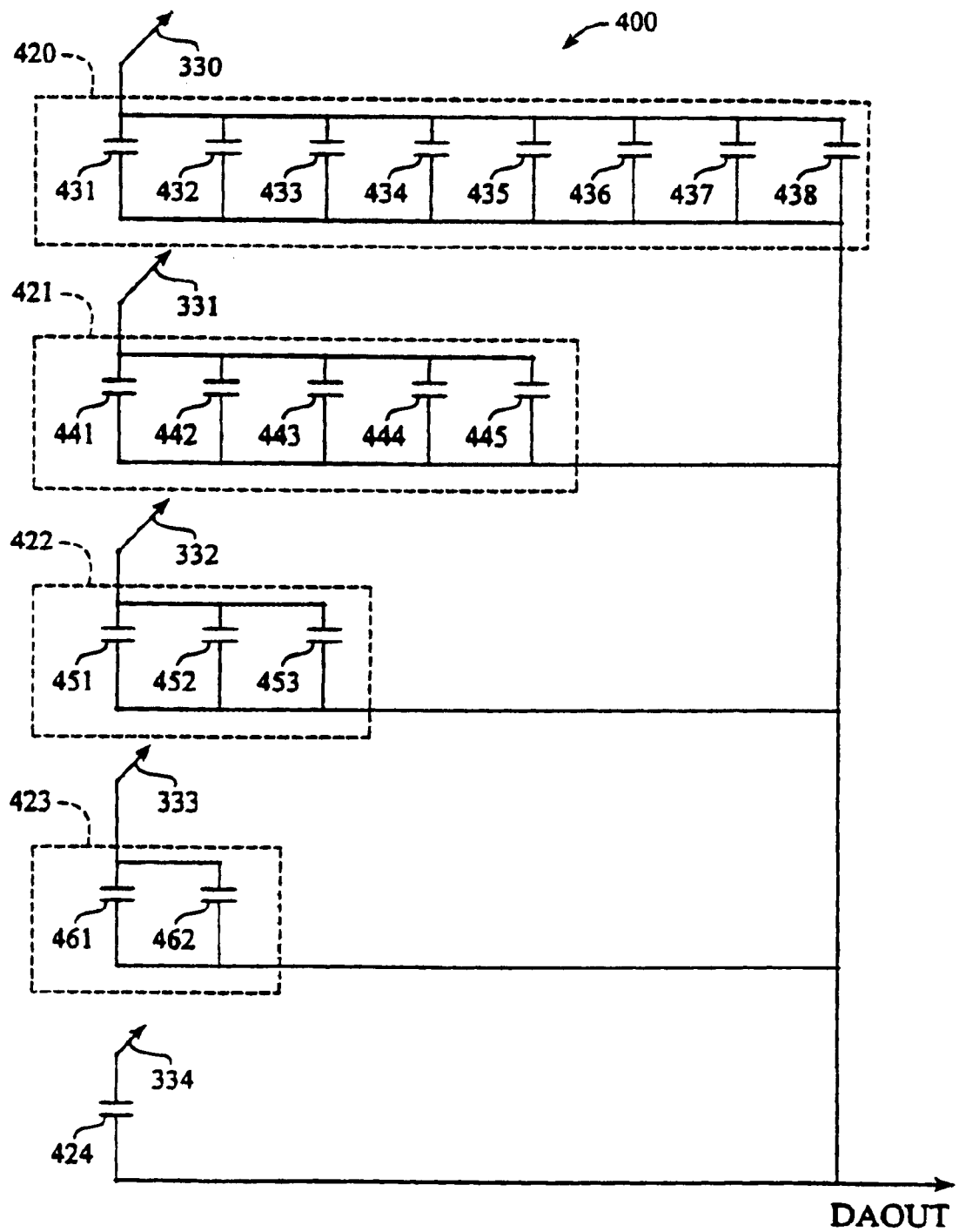
FIG. 3B is a block diagram of a floating radix charge redistribution system for adaptive calibration according to one embodiment of the present invention.

Referring now to FIG. 3A, there is shown a block diagram of a charge redistribution system 203 including a bank of radix less-than-two capacitors for adaptive calibration in connection with present invention. In particular, the Figure shows a block diagram of a fixed or floating radix less-than-two charge redistribution DAC (i.e., a CRDAC) system 203 according to the present invention. In particular, CRDAC 203 includes an input voltage (VIN) lead 300; a reference voltage (VREF) lead 301; and a ground lead (GND) 302. CRDAC 203 further includes a plurality of switches 330–334 each independently actuable by the state of a bit b(n) in a control word used to select particular ones of capacitors 340–344 for connection to either VIN, VREF, or GND. CRDAC 203 further includes a corresponding plurality of fixed or floating radix less-than-two capacitors 340–344. These capacitors include a dummy capacitor Cd, and each capacitor is connected to a corresponding one of switches 330–334. Leads 300–302 are selectively connectable to capacitors 340–344 by action of respective switches 330–334. A particular digital word comprising a plurality of b(n)'s is used to close individual ones of switches 330–334. to connect selected radix less-than-two capacitors to appropriate input voltages for sampling or conversion. Instead of capacitors, other charge carrying components such as resistors can be substituted as a separate embodiment according to the present invention. The values of respective capacitors 340–344 follow the function $$\gamma_j = \prod_{j=1}^{J} r_i$$

in which $1<r_i<2$. Thus, a radix value between one and two is an embodiment of the present invention. The individual radix values can be different or the same according to the present invention. The capacitors shown are a radix less-than-two capacitor array used as a companion bit charge redistribution DAC, according to one embodiment of the present invention. According to one embodiment of the present invention, the capacitors are scaled as radix less-than-two capacitors, with the capacitance of each next capacitor or non-capacitive substitute element being a radix function of its neighbor, i.e., $C_x=f(r)*C_{x-1}$, where r is a selected positive real number less than or equal to two, according to one embodiment. Further according to one embodiment of the present invention, $C_n=r^n \times C_0$, where r is a number between zero and two; n is a selected positive integer. Each of the capacitors is connected to a switch that is settable to couple to VIN, VREF, or GND.

Referring now to FIG. 38, there is shown a block diagram of a floating radix charge redistribution system 400 for adaptive calibration according to one embodiment of the present invention. In particular, CRDAC system 400 includes a plurality of switches 330–334 each independently actuable by the state of a bit b(n) in a control word used to select particular ones of capacitors 420–424 for connection to either VIN, VREF, or GND) (or common mode, CM). According to one embodiment of the present invention, capacitors 420–424 are a step-wise floating radix redundant array of capacitors. In other words, the value relationship between successive components (e.g. capacitors) may still be radix-less-than two, but it will not necessarily be the same radix value for particular selected pairs of components. According to one embodiment of the present invention, capacitors 420–424 are each the interconnection of plural individual capacitors, taken in parallel. Each capacitor may have the same approximate unit capacitance value. To obtain a desired composite capacitance, the unit capacitors are interconnected according to any appropriate interconnection scheme to produce a desired capacitance level, whether by series or parallel or other (e.g., hybrid) interconnection approach. For example, first capacitor 420 includes eight individual unit value capacitors 431–438. Capacitor 421 includes five individual capacitors 441–445. Capacitor 422 includes three individual capacitors 451–453. Capacitor 423 includes individual capacitors 461–462. Single capacitor 424 is a unit value capacitor. According to one embodiment of the present invention, each set of capacitors 420–424 is a combination of capacitors each having a selected unit capacitance value. Accordingly, the relative capacitances of respective capacitors 420–424 are eight (8) to five (5) to three (3) to two (2), establishing a step-wise floating radix relationship. A fixed or invariant radix relationship maintains the same ratio of successive values for successive capacitors. For example, in a fixed radix two capacitor array of the prior art, there are successive capacitor pairs which are respectively value ratioed at two to one. Thus, if the value of a first capacitor in the array is 8 pf, the value of the next in order capacitor will be one-half that, i.e., 4 pf. The next in order capacitor thereafter will be valued at 2 pf. On the other hand, according to the present invention, a radix-less-than two array has redundancy as shown in the Figure, with the value of the first, capacitor 420 being eight, and the next in order capacitor 421 having a value of five (rather than four in the radix two case which lacks redundancy). The next in order capacitor 422 has three capacitors. Thus, if capacitor 420 in the FIG. is erroneously not selected for approximation in the course of calibration or SAR processing, due to noise or another mechanism, there is sufficient capacitive value redundancy to represent the value being approximated with multiple less significant capacitances rather than with the erroneously non-kept more significant capacitance. According to one embodiment of the present invention, the individual capacitors or other charge carrying components are multiplied or consistently scaled for redundancy. According to one embodiment of the present invention, each such capacitor or component is fabricated out of a selected one or more subcapacitors or subcomponents. According to one embodiment of the present invention, the values of each of the subcapacitances or subcomponents is approximately one. This is particularly suitable for implementation in a semiconductor array comprising a plurality of substantially equal semiconductor capacitance elements, which are selectably interconnected to construct respective ones of the scaled capacitors or other charge carrying components. Interconnection may be accomplished according to any appropriate interconnection scheme to produce a desired capacitance level, whether by series or parallel or other (e.g., hybrid) interconnection approach. CRDAC system 400 further includes a comparator (not shown) which is connected to capacitors 420–424; and it includes a comparator bypass switch (not shown) to enable sampling operation. Leads 300–302 shown in FIG. 4A are selectively connectable to capacitors 420–424 by action of respective switches 330–334.

Figure 4:
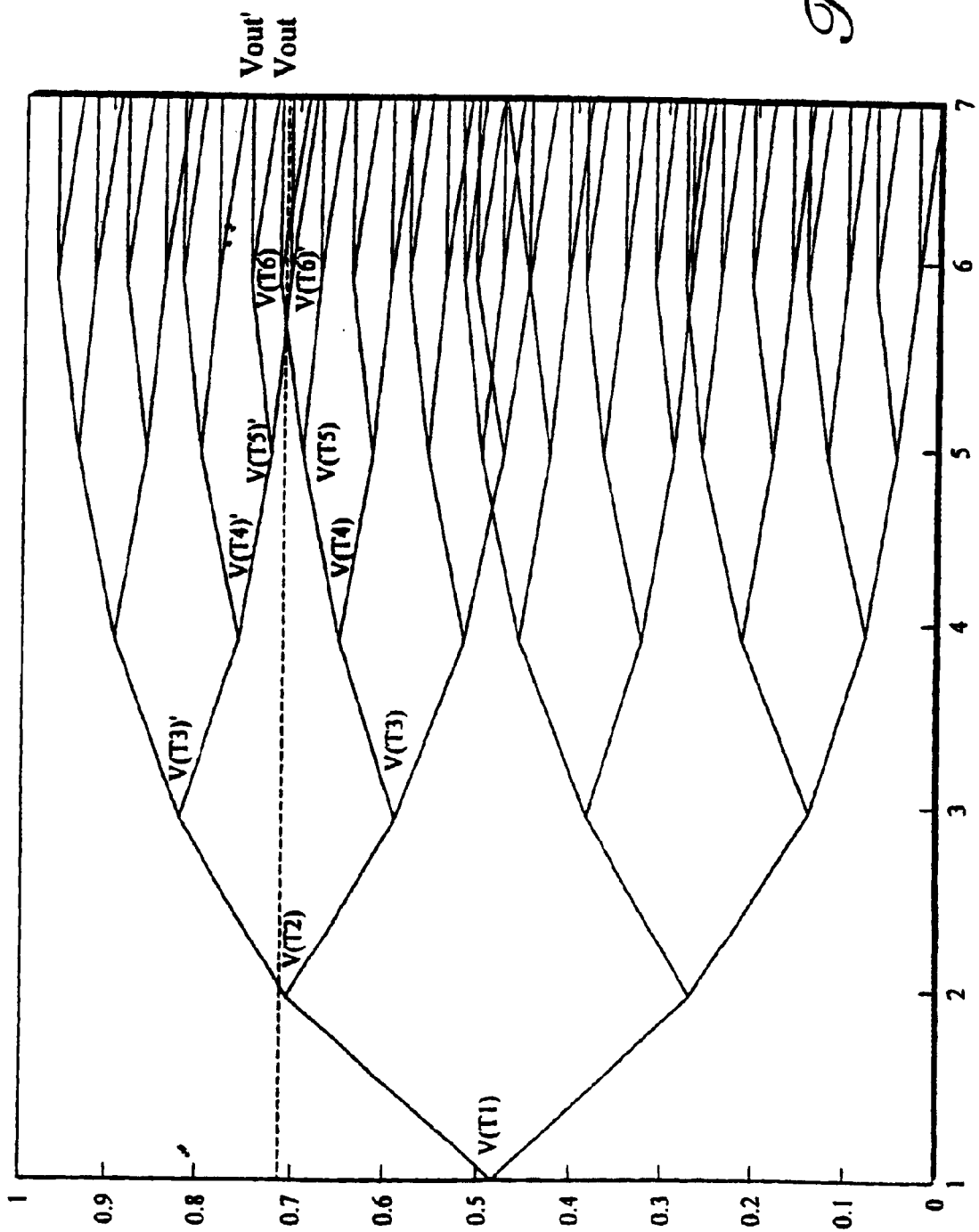
FIG. 4 is a graph of a generalized decision tree for a successive approximation method which can be used with the present invention.

Referring now to FIG. 4, there is shown a generalized decision tree for successive approximation according to the present invention. In particular, the Figure is a graph of normalized array weight over input weight as a function of decision number. It is seen that the number of cycles for conversion to an N-bit word is N, according to one embodiment of the present invention. The Figure shows the steps of successive approximation of a sampled input voltage VIN with successive sets of balancing capacitors. Each set of balancing capacitors according to the present invention includes a most significant set of capacitors including representation of a corresponding set of companion bits. In the Figure, a first approximation VT2 is made, which is less than the actual sampled voltage VIN. Accordingly, the significant one of the first set of balancing capacitors (not including the associated companion bits) is kept and is included as part of a next test set of balancing capacitors including companion bit capacitors. Each new set of tested balancing capacitors includes a next set of balancing capacitors including a corresponding set of companion bit capacitors. Thus according to the present invention, companion bit approximation uses successive sets of radix scaled balancing capacitors monotonically to approach the level of the sampled voltage. The scaling is alternatively radix-less-than two, ordered, floating, or irregular. Use of the companion bits may cause non-inclusion of a particular balancing capacitor and non-retention of a significant test bit, but this is non-detrimental, because the capacitor array according to the present invention includes sufficient remaining redundancy to enable alternative components of sufficient cumulative magnitude accurately to represent the value being approximated. According to the present invention, successive significant balancing capacitors are identified and the number of kept bits identifying the retained significant balancing capacitors is progressively increased. The total capacitance of the resultant set of balancing capacitors thus monotonically increases in charge carrying capacity within an envelope of values between the prior kept bit set and the currently tested potentially kept bit set of cumulative capacitances. According to one embodiment of the present invention, the companion bits at each step of successive approximation cause bisection of the envelope between prior and future potentially next included sets of MSB value capacitances. Thus, companion bits are used during successive approximation to provide a limited bias against including a particular tested capacitor in the set of kept MSB approximating capacitors. This ensures monotonicity in successive approximation and avoids erroneous, noise-induced inclusion of a too-large balancing capacitor in the final set of balancing capacitors. Instead of capacitors, other charge carrying components such as resistors can be substituted as another embodiment.

Figure 5:
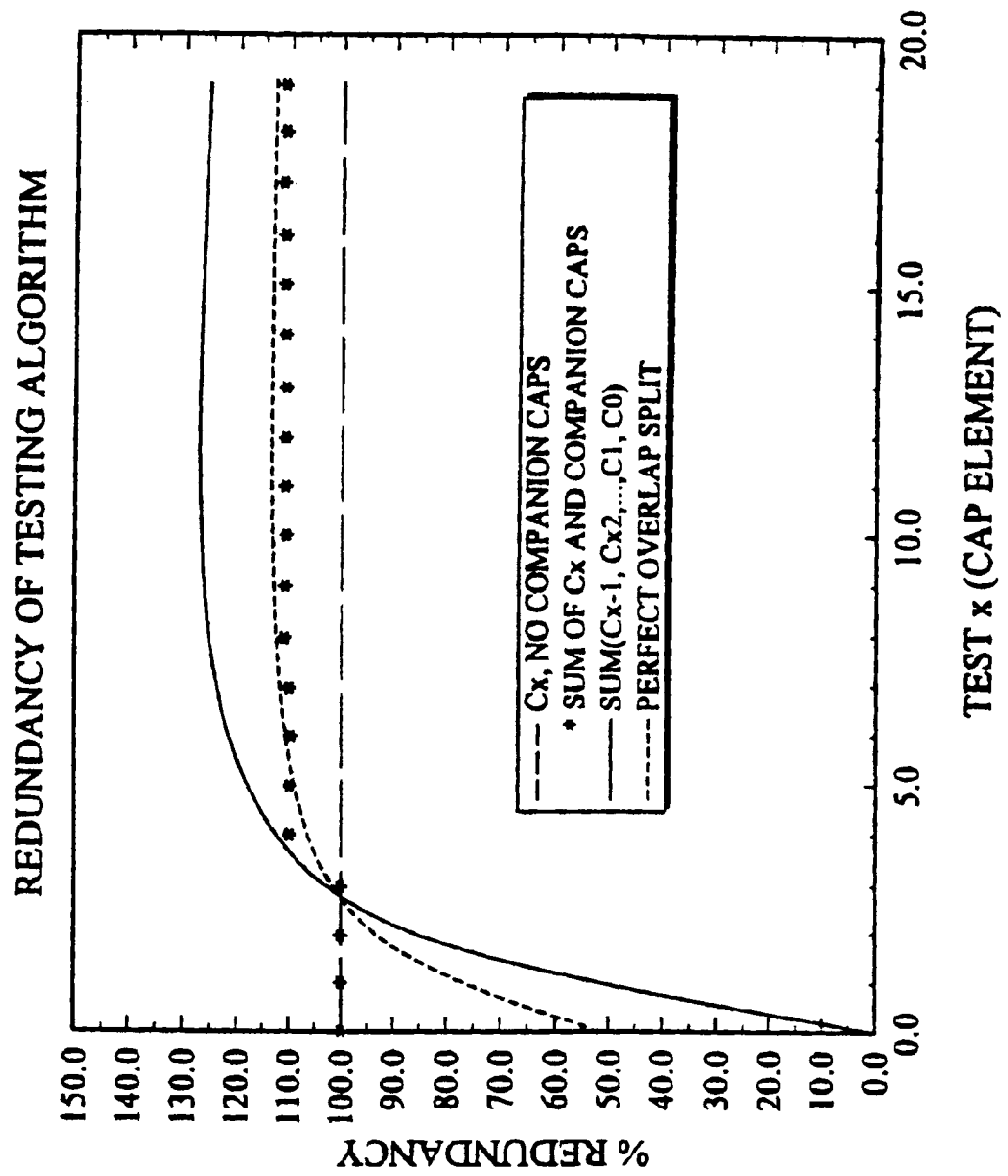
FIG. 5 is a graph of percentage redundancy for a tested bit value versus the number of capacitor elements tested.

Referring now to FIG. 5, there is shown a graph of percentage redundancy for a tested bit value versus the number of capacitor elements tested. The respective curves show the percentage of redundancy for a selected capacitor value Cx without companion bits, the percentage of redundancy for a sum of Cx and associated companion bits, the percentage redundancy for the sum of capacitances Cx-1, Cx2 through C1 and C0, and the percentage redundancy for a perfect overlap split, according to the present invention.

Figure 6A:
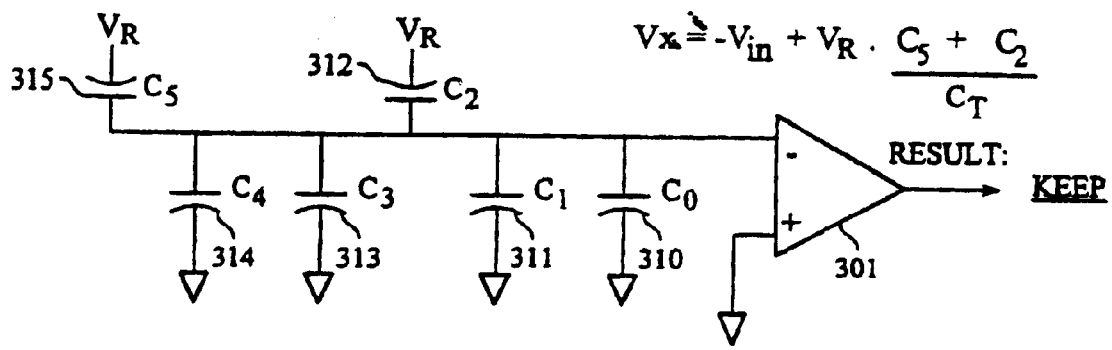
FIG. 6A is a diagram of a charge redistribution system which is approximating an input voltage with a test voltage equal to a reference voltage times the ratio of a sum of fifth and second capacitances over the total bank capacitance.

Referring now to FIGS. 6A, there is shown a diagram of a charge redistribution system which is approximating an input voltage with a test voltage equal to a reference voltage times the ratio of a sum of fifth and second capacitances over the total bank capacitance. In particular, the Figure shows respective diagrams of a unitary or multiple radix less-than-two CRDAC system according to the present invention connected in first, second, and third operational modes. According to one embodiment, the CRDAC system includes a common mode grounded comparator 301, a closed by-pass switch (not shown) to enable sampling, and an equivalent capacitor ($C_T$) including a complete set of all radix less-than-two capacitors, i.e., $C_0$–$C_5$, chosen for sampling to an unknown magnitude input voltage VIN in a sampling mode of operation for the CRDAC system. For calibration according to the present invention, selected test sampling capacitors sample VREF. The CRDAC system includes a balancing set of radix less-than-two capacitors C(N) connected to VREF, with a set of remaining capacitors $C_T$–C(N) being connected to common mode. When the positive voltage contribution of $[C(N)/C_T]^*$VREF including the contribution of companion bits according to the present invention, is balanced against the negative image (–VIN) of the sampled voltage, then an analog residue remains having a positive, negative or null value. According to the present invention, balancing is done as well in a digital counterpart process in which digital weights represent the balancing and sampled capacitors cancel each other out in a calibration process in which digital sampling and balancing weights are subtracted from each other to produce a signed digital residue. Unknowns can be determined as well, by sampling an unknown voltage and then testing for an approximation with digital balancing weights and associated balancing capacitors until the charge sampled is cancelled. In the example shown, the fifth capacitor is kept, resulting in a keep decision for the particular capacitor. The second capacitor has served a useful role in representing a companion bit, but it is not kept, as a partial representation of the voltage being balanced.

Figure 6B:
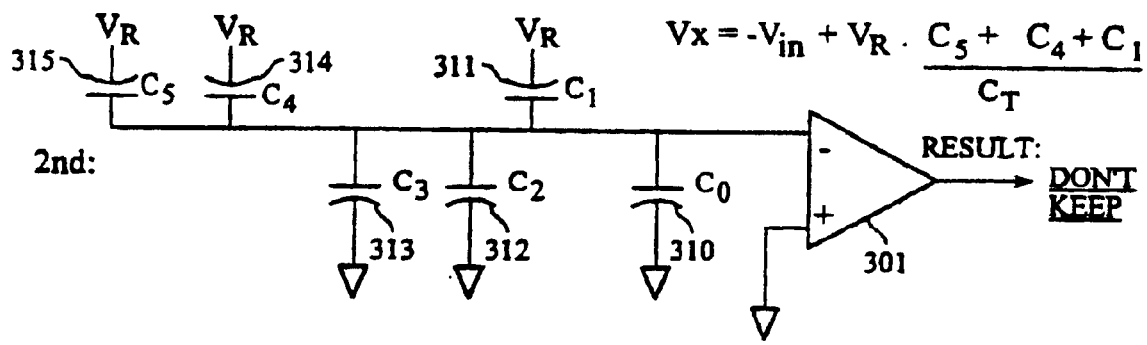
FIG. 6B is a diagram of a charge redistribution system which is approximating an input voltage with a test voltage equal to a reference voltage times the ratio of a sum of first, fourth, and fifth capacitances over the total bank capacitance.

Referring now to FIG. 6B, there is shown a diagram of a charge redistribution system which is approximating an input voltage with a test voltage equal to a reference voltage times the ratio of a sum of first, fourth, and fifth capacitances over the total bank capacitance. In particular, the Figure shows respective diagrams of a unitary or multiple radix less-than-two CRDAC system according to the present invention connected in first, second, and third operational modes. According to one embodiment, the CRDAC system includes a common mode grounded comparator 301, a closed by-pass switch (not shown) to enable sampling, and an equivalent capacitor ($C_T$) including a complete set of all radix less-than-two capacitors, i.e., $C_0$–$C_5$, chosen for sampling to an unknown magnitude input voltage VIN in a sampling mode of operation for the CRDAC system. For calibration according to the present invention, selected test sampling capacitors sample VREF. The CRDAC system includes a balancing set of radix less-than-two capacitors C(N) connected to VREF, with a set of remaining capacitors $C_T$–C(N) being connected to common mode. When the positive voltage contribution of $[C(N)/C_T]^*$VREF including the contribution of companion bits according to the present invention, is balanced against the negative image (–VIN) of the sampled voltage, then an analog residue remains having a positive, negative or null value. According to the present invention, balancing is done as well in a digital counterpart process in which digital weights represent the balancing and sampled capacitors cancel each other out in a calibration process in which digital sampling and balancing weights are subtracted from each other to produce a signed digital residue. Unknowns can be determined as well, by sampling an unknown voltage and then testing for an approximation with digital balancing weights and associated balancing capacitors until the charge sampled is cancelled. In the example shown, the fifth capacitor is kept, resulting in a continued keep decision for the particular capacitor. However, the fourth capacitor is rejected and is not kept. Additionally, the first capacitor which represents a companion bit for the fourth capacitor which is being tested in combination with the already kept fifth capacitor, is not kept, because its magnitude is excessive.

Figure 6C:
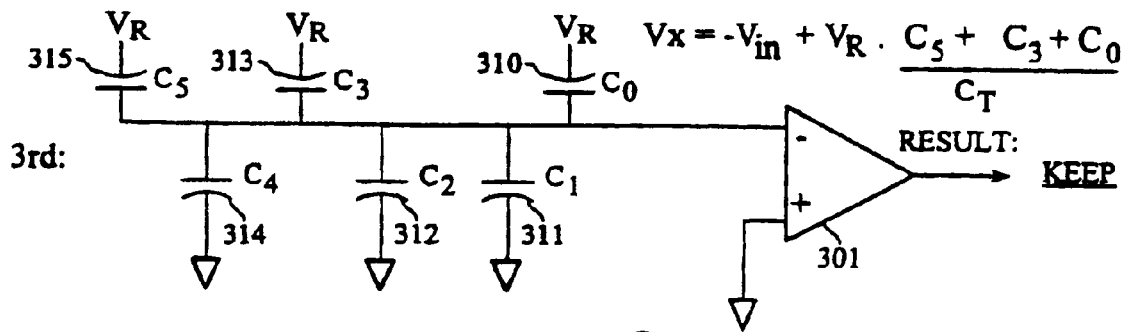
FIG. 6C is a diagram of a charge redistribution system which is approximating an input voltage with a test voltage equal to a reference voltage times the ratio of a sum of fifth, third, and zeroth capacitances over the total bank capacitance.

Referring now to FIGS. 6C, there is shown a diagram of a charge redistribution system which is approximating an input voltage with a test voltage equal to a reference voltage times the ratio of a sum of fifth, third, and zeroth capacitances over the total bank capacitance. In particular, the Figure shows respective diagrams of a unitary or multiple radix less than-two CRDAC system according to the present invention connected in first, second, and third operational modes. According to one embodiment, the CRDAC system includes a common mode grounded comparator 301, a closed by-pass switch (not shown) to enable sampling, and an equivalent capacitor ($C_T$) including a complete set of all radix less-than-two capacitors, i.e., $C_0$–$C_5$, chosen for sampling to an unknown magnitude input voltage VIN in a sampling mode of operation for the CRDAC system. For calibration according to the present invention, selected test sampling capacitors sample VREF. The CRDAC system includes a balancing set of radix less-than-two capacitors C(N) connected to VREF, with a set of remaining capacitors $C_T$–C(N) being connected to common mode. When the positive voltage contribution of $[C(N)/C_T]^*$VREF including the contribution of companion bits according to the present invention, is balanced against the negative image (–VIN) of the sampled voltage, then an analog residue remains having a positive, negative or null value. According to the present invention, balancing is done as well in a digital counterpart process in which digital weights represent the balancing and sampled capacitors cancel each other out in a calibration process in which digital sampling and balancing weights are subtracted from each other to produce a signed digital residue. Unknowns can be determined as well, by sampling an unknown voltage and then testing for an approximation with digital balancing weights and associated balancing capacitors until the charge sampled is cancelled. In the example shown, the third capacitor is kept, in consequence of a keep decision for the particular capacitor. The zeroth capacitor has served a useful role in representing a companion bit, but it is not kept.

Figure 6D:
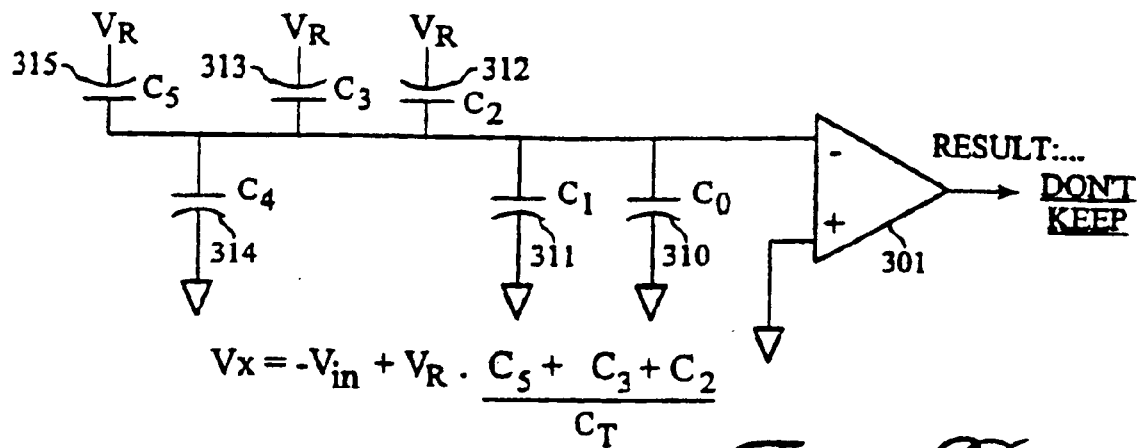
FIG. 6D is a diagram of a charge redistribution system which is approximating an input voltage with a test voltage equal to a reference voltage times the ratio of a sum of fifth, third, and second capacitances over the total bank capacitance.

Referring now to FIG. 6D, there is shown a diagram of a charge redistribution system which is approximating an input voltage with a test voltage equal to a reference voltage times the ratio of a sum of fifth, third, and second capacitances over the total bank capacitance. In particular, the Figure shows respective diagrams of a unitary or multiple radix less-than-two CRDAC system according to the present invention connected in first, second, and third operational modes. According to one embodiment, the CRDAC system includes a common mode grounded comparator 301, a closed by-pass switch (not shown) to enable sampling, and an equivalent capacitor ($C_T$) including a complete set of all radix less-than-two capacitors, i.e., $C_0$–$C_5$, chosen for sampling to an unknown magnitude input voltage VIN in a sampling mode of operation for the CRDAC system. For calibration according to the present invention, selected test sampling capacitors sample VREF. The CRDAC system includes a balancing set of radix less-than-two capacitors C(N) connected to VREF, with a set of remaining capacitors $C_T$–C(N) being connected to common mode. When the positive voltage contribution of $[C(N)/C_T]$*VREF including the contribution of companion bits according to the present invention, is balanced against the negative image (–VIN) of the sampled voltage, then an analog residue remains having a positive, negative or null value. According to the present invention, balancing is done as well in a digital counterpart process in which digital weights represent the balancing and sampled capacitors cancel each other out in a calibration process in which digital sampling and balancing weights are subtracted from each other to produce a signed digital residue. Unknowns can be determined as well, by sampling an unknown voltage and then testing for an approximation with digital balancing weights and associated balancing capacitors until the charge sampled is cancelled. In the example shown, the second capacitor will not be kept. No capacitor has served a companion bit role, because no lower magnitude capacitor below the level of the zeroth capacitor is available for companion bit SARing.

Figure 6E:
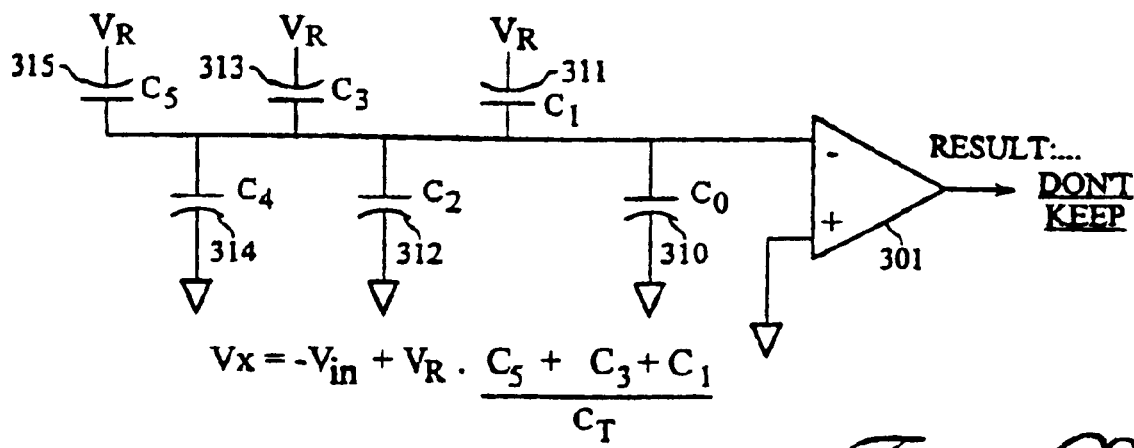
FIG. 6E is a diagram of a charge redistribution system which is approximating an input voltage with a test voltage equal to a reference voltage times the ratio of a sum of fifth, third, and first capacitances over the total bank capacitance.

Referring now to FIG. 6E, there is shown a diagram of a charge redistribution system which is approximating an input voltage with a test voltage equal to a reference voltage times the ratio of a sum of fifth, third, and first capacitances over the total bank capacitance. In particular, the Figure shows respective diagrams of a unitary or multiple radix less-than-two CRDAC system according to the present invention connected in first, second, and third operational modes. According to one embodiment, the CRDAC system includes a common mode grounded comparator 301, a closed by-pass switch (not shown) to enable sampling, and an equivalent capacitor ($C_T$) including a complete set of all radix less-than-two capacitors, i.e., $C_0$–$C_5$, chosen for sampling to an unknown magnitude input voltage VIN in a sampling mode of operation for the CRDAC system. For calibration according to the present invention, selected test sampling capacitors sample VREF. The CRDAC system includes a balancing set of radix less-than-two capacitors C(N) connected to VREF, with a set of remaining capacitors $C_T$–C(N) being connected to common mode. When the positive voltage contribution of $[C(N)/C_T]$*VREF including the contribution of companion bits according to the present invention, is balanced against the negative image (–VIN) of the sampled voltage, then an analog residue remains having a positive, negative or null value. According to the present invention, balancing is done as well in a digital counterpart process in which digital weights represent the balancing and sampled capacitors cancel each other out in a calibration process in which digital sampling and balancing weights are subtracted from each other to produce a signed digital residue. Unknowns can be determined as well, by sampling an unknown voltage and then testing for an approximation with digital balancing weights and associated balancing capacitors until the charge sampled is cancelled. In the example shown, the first capacitor will not be kept. No capacitor has served a companion bit role, because no lower magnitude capacitor below the level of the zeroth capacitor is available for companion bit SARing.

Figure 7:
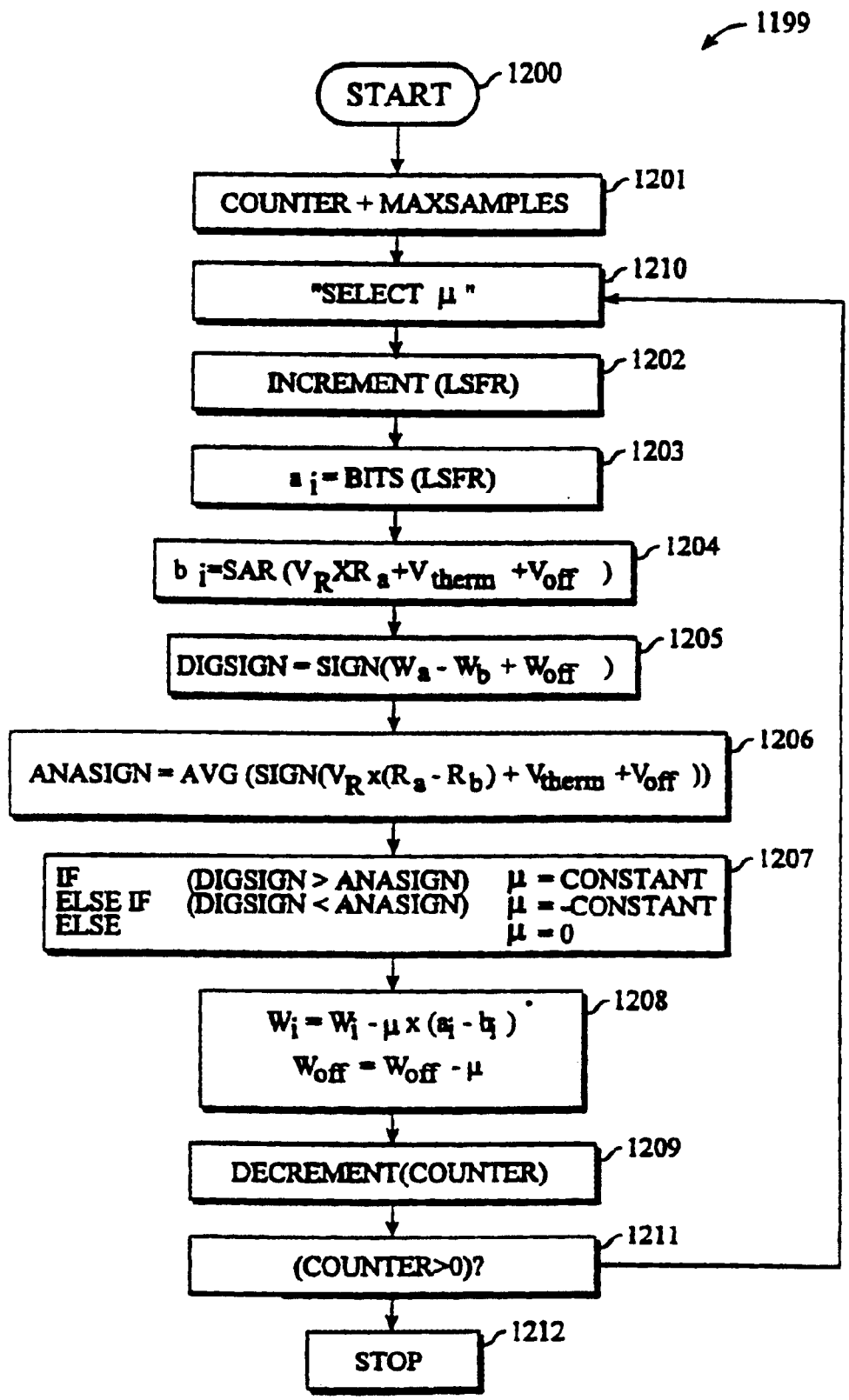
FIG. 7 is a flow chart of a digital weight calibration method according to the present invention.

Referring now to FIG. 7, there is shown a flow chart of an adaptive capacitor digital weight calibration method 1199 according to the present invention. In particular, FIG. 7 shows the calibration method 1199 including starting 1200 calibration, and setting or resetting 1201 a counter to a selected maximum sample number. Further, the calibration method 1199 includes providing 1202 a pseudorandom (referred to as "random" herein) input by incrementing a linear feedback shift register, selecting 1203 sampling capacitors from the random bits determined by the LFSR, as well as sampling and converting 1204 to approximate the sampling bit set $a_i$ with a balancing bit set b; which includes predetermined companion bits. Further, the calibration method 1199 determines 1205 the sign of the digital residue by taking the difference between sample and balancing bit weights plus the offset weight, and determining 1206 the residue. The signed digital residue is determined by adding the offset voltage weight to the balancing bit weight and subtracting therefrom the sample bit weight. The signal analog residue is obtained by determining the average sign of the sum of the thermal and offset voltages and adding thereto the reference voltage times the difference of the balancing and sample voltage ratios. According to the present invention, the difference between the signed analog and digital residues is a sign error feedback value which modifies particular digital weights in memory by determining an average of the sum of offset and thermal voltages plus the product of the reference voltage times the difference between sample and balancing voltage ratios. The calibration method 1199 further includes deciding 1207 the direction of the error based upon sign information, causing the feedback constant $\mu$ to be set to a particular constant level depending upon the number of samples. In case the digital sign is greater than the analog sign, $\mu$ is set to the negative of the particular selected constant level. A positive $\mu$ is used if the digital sign is less than the analog sign. Finally, $\mu$ is set to zero if the digital and analog residue signs are the same. The calibration method 1199 further includes adjusting 1208 particular digital weights including the offset weight respectively by an amount equal to the feedback constant p times the difference between a particular sampling and balancing bit, and by the feedback constant itself in the case of the offset weight, and decrementing 1209 a counter to complete an iteration of the number of samples. The calibration method 1199. further includes determining 1210 whether the value of the sample counter is greater than zero, and if so then repeating linear feedback shift register incrementation step 1202 and the steps which follow, and if not then determining 1211 whether to decrement $\mu$ and if so then resetting the sample counter and repeating the calibration method from step 1201, and the finally halting 1212 calibration operation at completion. Determining the sign of the analog residue is accomplished 1206 by subtracting the balancing capacitor ratio $R_b$ from the sampling capacitor ratio $R_a$. Determining the sign of the digital residue is accomplished 1205 by subtracting $W_b$ from $W_a$ and adding $W_{off}$. Since the first SAR approximation relates to the most significant bit, the magnitude of P according to the present invention is smallest when the number of samples to be taken is large. The calibration method 1199 according to the present invention further depends upon the following relationships: $Q_{samp}=Q_{onv}$, where $Q_{samp}$ is the charge sampled and $Q_{onv}$ is the charge converted; and $V_R \times C_a + Q_{therm} + Q_{inject} = V_R \times C_b - (V_{os} - V_x) \times C_{tot}$, where $V_R$ is a selected reference voltage, $C_0$ is the capacitance of a first capacitor group, $Q_{therm}$ is the thermal charge, $Q_{inject}$ is the injected charge, $C_b$ is the capacitance of a second capacitor group, $V_{os}$ is an offset voltage value, $C_{tot}$ is the total capacitance, and $V_x$ is the analog residue voltage. Further, $$C_a = \sum_i (a_i \times C_i); \text{ and } C_b = \sum_i (b_i \times C_i); \text{ for } a_i, b_i, \in \{0,1\} \text{ for } a_i\, b_i.$$

The capacitance values $C_a$ and $C_b$ represent first and second groups of capacitors respectively the groups of sampling and balancing capacitors, with $a_i$ and $b_i$ being the sets of binary coefficients that determine whether the ith capacitor is part of a particular capacitor group or not. The sampling bits $a_i$ are not equal to the successive approximation register result bits $b_i$, because the successive-approximation testing method according to the present invention adds extra weight by use of companion bits to each test, skewing the results in the direction of the overlap of the system. If only the most significant bit in the sampling bits $a_i$ were to be used, the extra weight added to the first test by the companion bits would cause the MSB not to be selected for inclusion in the group of $b_i$ bits determined for balancing the charge produced by the sampling bits, according to the present invention. Some other combination of capacitors whose collective weight is substantially equal to the MSB would instead be selected according to the present invention. Further, $$V_R \times C_a + Q_{therm} + Q_{inject} = V_R \times C_b - (V_{OS} - V_x) \times C_{tot};$$

$$V_x \times C_{tot} = V_R \times (C_a - C_b) + Q_{therm} + Q_{inject} + V_{os} \times C_{tot};$$

$$V_x = V_R \times \frac{(C_a - C_b)}{C_{tot}} + V_{therm} + (V_{inject} + V_{os});$$

$$R_a = \frac{C_a}{C_{tot}} = \frac{\sum_i (a_i \times C_i)}{C_{tot}};$$

$$R_b = \frac{C_b}{C_{tot}} = \frac{\sum_i (b_i \times C_i)}{C_{tot}}; \text{ and}$$

Accordingly, the signed analog residue is a function of the difference of sampling and balancing capacitor rates:

$$V_x = V_R \times (R_a - R_b) + V_{therm} + V_{off}$$

The sampling capacitors $a_i$ and the conversion result capacitors $b_i$ are both known. The sign of the residue voltage $V_x$ is known. Thus, the signed analog residue, $V_x = V_R \times (R_a - R_b) + (V_{therm} + V_{off})$; and the digital residue, $W_x = (W_a - W_b) + (W_{off})$. The weights $W_a$, $W_b$, and $W_{off}$ are adapted so that the sign of the digital residue $W_x$ matches the average analog residue sign. Thus, $$\text{Sign } (W_x) = \text{Avg}(\text{Sign}(V_x)) \text{ when} \{R_a, R_b, V_{off}/V_R\} = \{W_a, W_b, W_{off}\};$$

and $$V_x = V_R \times (R_a - R_b) + V_{therm} + V_{off};$$

$$W_x = (W_a - W_b) + W_{off};$$

$$W_a = \Sigma_i (a_i \times W_i);$$

and $$W_b = \Sigma_i (b_i \times W_i).$$

Further:

$$V_x = V_R \times (R_a - R_b) + V_{therm} = V_{off};$$

$$W_x = (W_a - W_b) + W_{off};$$

$$W_i[k+1] = W_i[k] - \mu \times (a_i - b_i);$$

and $$W_{off}[k+1] = W_{off}[k] - \mu.$$

The comparator noise at the time of the analog residue sign-check helps dithering and improves convergence speed and final resolution according to the present invention. Averaging the thermal noise according to the present invention improves the final achievement of convergence. Thermal noise is averaged according to the present invention by re-sampling the input capacitors and "plugging-in" the same output capacitors as used in the prior conversion, then checking the sign of each new residue. According to the present invention, the same $a_i$'s as the previous sampling cycle are resampled and re-balanced with the same $b_i$'s as in the result of the previous conversion cycle. Then, the sign of the analog residue is checked with other sign results associated with those sets of $a_i$'s and $b_i$'s. Resampling according to the present invention is performed with the $a_i$'s, and balancing the charge is performed with the $b_i$'s for the sign-checks. Thermal noise is bound up in the $b_i$'s from the conversion process. The two sets of weights are not equal, but they are close enough to each other to provide useful information about the relationships of the capacitor combinations. Comparator noise is accordingly averaged every time the sign is rechecked.

Figure 8:
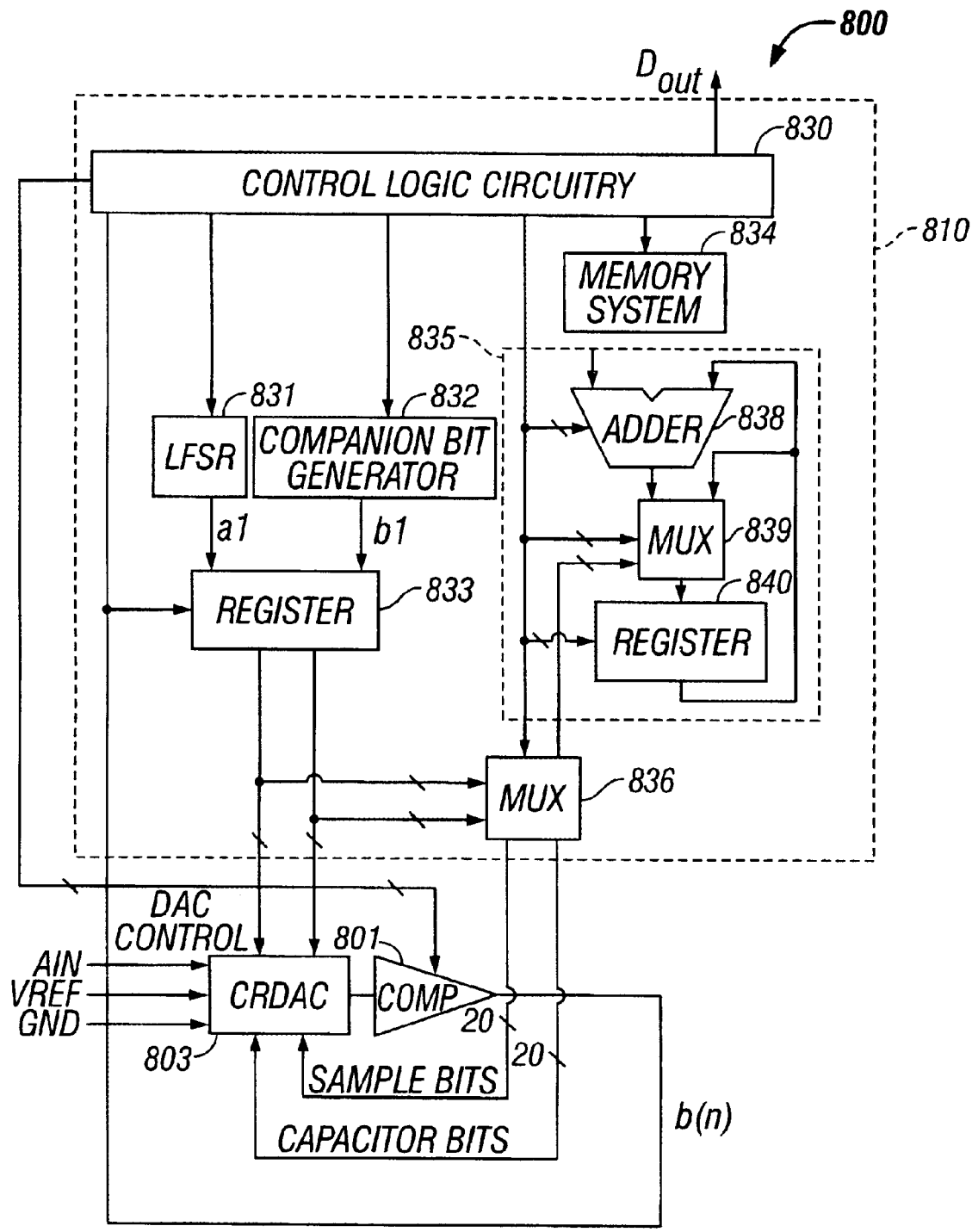
FIG. 8 is a block diagram of a charge redistribution digital-to-analog converter system, used for companion bit successive approximation according to the present invention.

Referring now to FIG. 8, there is shown a block diagram of a radix less-than-two adaptive calibration bit charge redistribution successive approximation (SAR) converter system 800 according to another embodiment of the present invention. In particular, the converter system 800 includes a comparator system 801 having first and second inputs receiving respective reference (REF) and digital-to-analog converter (DAC) outputs. The converter system 800 further includes a radix-less-than-two non-configurable DAC 803 and a computational engine 810 according to one embodiment of the present invention. The engine 810 is configured to produce DAC control signals according to one embodiment of the present invention, and to produce output values Dout in response to input signals VREF, GND, AND AIN received by the radix-less-than-two non-configurable DAC 803. The computational engine 810 includes control logic circuitry 830, a linear feedback shift register (LFSR) 831, a companion bit generator 832, a register 833, a memory system 834 connected to control logic circuitry 830, and an accumulator system 835, and a multiplexer 836. The accumulator system 835 in turn includes an adder 838, a multiplexer 839, and a register 840. One input of comparator system 801 is connected to radix-less-than-two non-configurable DAC 803, to enable receipt of an output signal. Another input of comparator 801 is connected to radix-less-than-two non-configurable DAC 803, to enable receipt of an input reference signal. The comparator system 810 produces an output binary signal set b(n) which is provided to register 833 and control logic circuitry 830. The control logic circuitry 830 stores values in memory system 834 and produces DAC control signals for radix-less-than-two non-configurable DAC 802. The accumulator system 835 is connected to memory system 834 for receiving memory information for accumulation and to produce an output signal Dout in response to input signals VREF, GND, and AIN. In particular, SAR converter system 800 produces an output DOUT from engine 810. SAR system 800 includes control logic circuitry (CLC) 830 for producing the DOUT signals; and a charge redistribution digital-to-analog converter (CRDAC) 803 including a radix less-than-two capacitor bank, which has an output connected to one input of comparator system 801. CLC 830 includes a companion bit generator 832 and a LFSR 831. SAR converter system 800 includes a memory 834 for storing capacitor weight values; and an engine 810 connected to the output of comparator 801. SAR converter system 800 includes a comparator control circuit 801 for directing quasi autozero operation according to the present invention subject to direction from the engine 810. CRDAC 803 is selectively provided with an input voltage signal VIN, a reference voltage VREF, and a ground connection (GND) which may be a common node (CN) connection. Control logic circuitry 830 according to one embodiment of the present invention includes a digital representation of logic to control the calibration of CRDAC 803 with digital weights stored in calibration memory 834, and to modify feedback constants which modify the rate of change of digital weights during calibration and SAR processing. Memory system 834 is used for accumulating digital weights during SAR processing. Register 833 receives random sampling bits from LFSR 831 during calibration and conversion, and receives companion bits from companion bit generator 832. The LFSR 831 produces pseudo-random bit sequences to establish random sample bit sets for sampling operation incident to calibration. The comparator 801 feeds back sample bits $a_i$ and capacitor bits $b_i$ to CRDAC 803. Memory system 834 stores digital weights for modeling sampling and balancing capacitors, as well as representing offset voltages affecting SAR measurement. Control logic circuitry 830 increments the LFSR 831 to determine pseudo-randomly the selection of sample bits used in SAR processing for auto-calibrating the CRDAC 803. Then control logic circuitry 830 generates successive bit sequences including companion bits to connect progressively more comprehensive groups of balancing capacitors for in one case auto-calibration, or another case, approximation of unknown input analog voltages. Successive approximation results in recursively increasing the precision and accuracy of the digital weights which are stored in memory 834 as representations for sampling and balancing capacitors or voltage offsets. Accumulator system 835 produces a signed digital residue by comparing a sampling capacitor and balancing capacitor weights from memory system 834. A signed analog residue is produced from comparator 801 which is combined in multiplexer 839 with the signed digital residue from adder 838, to produce a sign error which is used to modify the digital weights representing the sampling and balancing capacitors as well as offset voltage weights according to the present invention. The memory system 834 provides sample and balancing weights to accumulator system 835 for subtractive combination. The memory system 834 receives input sampling signals $a_i$ and balancing signals $b_i$. The signal digital residue from accumulator system 835 is determined by adding an offset voltage weight to a digital balancing bit weight and subtracting therefrom a corresponding sample bit weight. The signed analog residue is obtained by determining the average sign of the sum of the thermal and offset voltages, plus a reference voltage times the difference of balancing and sample voltage ratios. According to the present invention, the difference between the signal analog and digital residues is an error feedback value for modifying digital weights in memory system 834.

Figure 9:
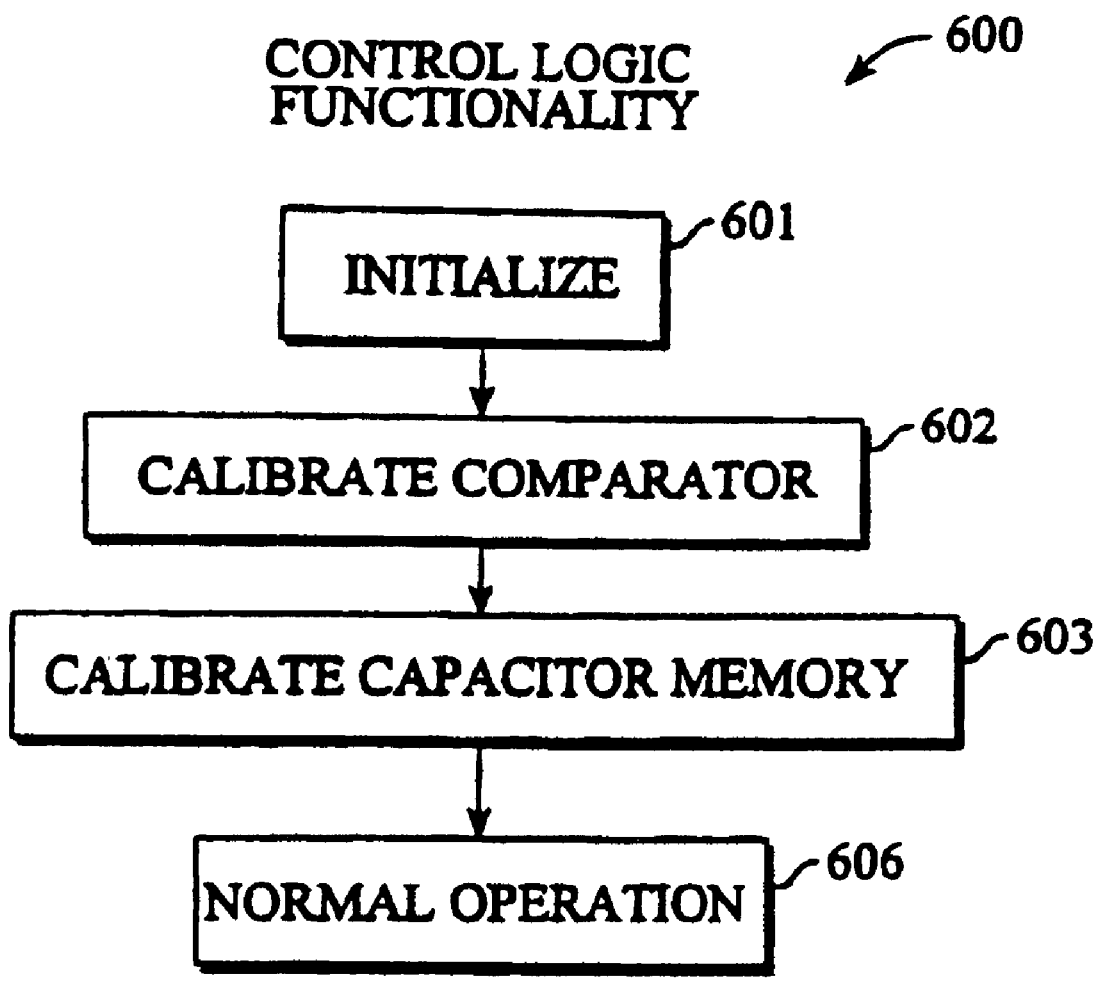
FIG. 9 is a flow chart of a control logic functionality according to the present invention.

Referring now to FIG. 9, there is shown a flow chart of a control logic functionality according to the present invention. In particular, the control logic functionality which is programmed into control logic circuitry 830 includes initialization 601, comparator calibration 602, calibration 603 of capacitor values for storage in memory system 834, followed by normal operation 606.

According to the present invention, the relative weights of the elements of each radix<2 series are determined by successive digital and analog processing. In particular, the successive approximation analog-to-digital converter (ADC) according to the present invention measures the relative non-binary values associated with sampling and balancing capacitors for storage as digital weights in a memory for the ADC. At each conversion step during DAC calibration, an analog signal corresponding to the sum of SAR determined radix<2 series values is compared with an analog reference input using randomly selected sampling capacitors. For successive approximation of unknown values, and analog signal corresponding to the sum of at least one of the series values plus a combination of predetermined companion bit values according to the present invention is compared with an analog input using randomly selected sampling capacitors. If the unknown charge or voltage value is greater than the sum of selected balancing capacitor values plus predetermined companion bit values having a gross value of on the order of 50% of the specific redundance corresponding to the particular significant bit value, the most significant capacitor of the balancing capacitor set is kept as part of the final successive approximation group to represent the sampled input voltage. If the selected balancing and companion bit set produces an approximation value in excess of the tested or sampled voltage value, the most significant capacitor of the attempted balancing set is not kept for further successive approximation relating to the particular sampled voltage value. The companion bits thus provide a bias against keep decisions. The companion bits thus provide an envelope or margin which prevents noise-induced over approximation of sampled values. The use of the companion bits accordingly promotes monotonicity and convergence to the approximated value without discontinuance or gaps in resolution. In particular, an n-shift invariant capacitor testing sequence according to one embodiment of the present invention divides a search space into first and second regions, enabling redundancy of radix-less-than-two capacitor scaling and permitting recovery across search-space boundaries in case of noise-induced incorrect successive approximation search decisions. Further according to one embodiment of the present invention, a companion bit group (CBG) includes a predetermined set of bits, each bit being separated from the next most significant bit in the companion bit group by at least two orders of magnitude, e.g., an n-shift invariant amount. Further according to one embodiment of the present invention, the number of companion bits is three, four, or five bits, for example without limitation. According to another embodiment of the present invention, the most significant of the companion bits is separated from the reference bit to which it is a companion by a separation space of at least two orders of magnitude. One bit sequence according to the present invention can be represented as XXX1001001, with the first "1" being a reference bit which is separated from the first companion bit by two "zero" bits which represent a separation of two orders of magnitude. Similarly, the separation between the second and third "1" bits is again two orders of magnitude, according to the indicated example. In a radix 1.8 system, the sum of the weights of the bits below a given bit can be as much as 1.25 times the weight of the bit itself. Further according to one embodiment of the present invention, the companion bit sequence adds up to 0.125, which is one half of the envelope amount between the normalized value of the given bit (i.e., "1") and the sum of the lesser bits (1.25). When added to the value of the given bit, i.e., 1.0, the test bit accordingly falls approximately half-way within the envelope between the value of the given bit and the sum of the weights of the bits below the given bit. The indicated system overlap or envelope according to the present invention diminishes as fewer and fewer bits remain below the selected test bit. The overlap is moreover lost when there are less than 3 bits below the test bit in a radix 1.8 system. According to the present invention, the overlap is in general approximately $1(r-1)$, for a sufficient number of capacitors, e.g., more than eight capacitors. The overlap for a given bit is more comprehensively $C_x(1/r^a))/(r-1)$, where a is the number of bits below the bit concerned. Normalizing for $C_x$, the cumulative companion bit weight equals $1/r^n+1/r^{3n}+1/r^{3n}+\ldots+1/r^{mn}$, where n is a selected shift value and m is a predetermined number of companion bits. To reach ½ of the overlap, the above cumulative companion bit weight according to one embodiment of the present invention, is set equal to $(1/(r-1)-1)/2$, resulting in $(1-1/r^{mn})/(r^n-1)=(2-n)/2(r-1)$. Then, neglecting $1/r^{mn}$ too small, for sufficient m and n, $n=(1(\log(2-r))/\log r)$. For r=1.8, n=approximately 4 according to the present invention. The value of n changes with r according to the present invention, so that another integer value n is applicable for radix 1.7 and 1.9. Such a system according to the present invention remains monotonic and symetrically noise tolerant during decision making incident to successive approximation.

What is claimed is:

1. A system for adaptive auto-calibration of radix<2 A/D SAR converters with internally generated stimuli, comprising:
   a plurality of DAC elements having element values ratioed by radix<2 with respect to at least one other element, the values of said plurality of DAC elements being subject to calibration;
   a memory for storing digital DAC element values; and
   a controller for determining values of said plurality of DAC elements for storage in said memory, based upon calibration operation using said DAC elements, and performing conversion of analog voltages into digital counterpart values, during conversion operation using calibration values of said DAC elements established during calibration and stored in said memory.

2. A method of constructing a capacitor system according to an envelope of indeterminate radix values between one and two, comprising:
   constructing an array of interconnected capacitors selectably individually connected at their non-interconnected sides to a selected reference voltage or to ground, said respective interconnected capacitors being fabricated with successively diminished capacitance values falling within an envelope of indeterminate radix values between one and two; and
   determining digital weight values for memory storage, said digital weight values being correspondingly representative of the successively diminished capacitance values.

3. A method of constructing a capacitor system including interconnected capacitors having unknown radix values between one and two, comprising:
   constructing an array of interconnected capacitors selectably individually connected at their non-interconnected sides to a selected reference voltage or to ground, said respective interconnected capacitors being fabricated with successively diminished capacitance values falling within an envelope of indeterminate radix values between one and two; and
   training a plurality of corresponding digital weight values for memory storage, said digital weight values being correspondingly representative of the successively diminished capacitance values.

4. A method of constructing a capacitor system including adjacent interconnected capacitors having random radix ratio values between one and two, selected to ensure redundancy, said method comprising:
   constructing an array of interconnected capacitors selectably individually connected at their non-interconnected sides to a selected reference voltage or to ground, said respective interconnected capacitors being fabricated with successively diminished capacitance values falling within an envelope of indeterminate radix values between one and two; and
   training a plurality of corresponding digital weight values for memory storage, said digital weight values being correspondingly representative of the successively diminished capacitance values.

5. A method of calibrating a charge redistribution digital-to-analog converter including a plurality of multi-valued electric components of magnitudes enabling redundant expression of electric charge values and including lesser magnitude companion components, comprising:
   producing a set of sampling bits to connect corresponding sampling components to a selected reference voltage;
   sampling the selected reference voltage with sampling components selected from said plurality of multivalued electric components;
   holding a negative of the charge sampled by the sampling components at an input of a comparator;
   producing a set of balancing bits including companion bits corresponding to balancing components selected to approximate a capacitance of the sampling components;
   approximating the charge sampled with a balancing charge from the companion bits enhanced balancing components;
   producing signed analog residue from a difference between the sampled and balancing charge amounts;
   generating digital weights corresponding to the sampling and the balancing bits and producing the difference therebetween as a signed digital residue; and
   correcting the generated digital weights based upon the difference between the signed analog and digital residues.

6. The method according to claim 5 wherein said set of sampling bits is variable.

7. The method according to claim 5 wherein said set of sampling bits is fixed.

8. A method of calibrating a charge redistribution digital to analog converter including a set of charge carrying components, comprising:

selecting a sampling set of charge carrying components in the charge redistribution digital-to-analog converter for sampling operation;

sampling a reference voltage with said selected charge carrying components;

selecting balancing sets of said charge carrying components including companion charge carrying components to cancel a charge sampled by said sampling set of charge carrying components; and determining digital weight values corresponding to said sampling and balancing sets of charge carrying components.

9. The method according to claim 5 wherein said companion bits are n-shift invariant.

10. The method according to claim 5 wherein said companion bits skew the cancellation of charge sampled to avoid approximation with balancing components of greater significance in favor of combinations of less significance balancing components.

11. A companion bit system, comprising:

a comparator having first and second inputs and an output;

a digital-to-analog converter (DAC) connected to said comparator and comprising a digitally calibrable charge carrying component array, and adapted for sampling and balancing selected electric quantities, and including switching circuitry for connecting particular ones of the charge carrying components from said charge carrying component array, to selected individual voltages selected from a group of voltage levels including particular input, reference, and ground levels;

logic circuitry connected to said DAC and the output of said comparator, said logic circuitry configured for connecting different ones of said charge carrying component for sampling and conversion operation to identify an analog sign residue and to establish digital calibration weights for said sampling and balancing charge carrying component sets enabling identification of a digital sign residue for comparison with said analog sign residue to enable digital weight adjustment, said logic circuitry further being configured for companion bit approximation, to provide a skew to push balancing capacitances into a redundancy region defined by the excess of the cumulative magnitude of lesser magnitude charge carrying components over a particular charge carrying component;

a memory for storing digital sampling and balancing calibration weights; and an accumulator for determining the differences between said sampling and balancing digital weights.

12. A method of calibrating a plurality of multi-valued electric charge carrying components comprising elements which enable redundant expression of electric charge values with two or more subsets of said plurality, comprising:

sampling a predetermined range of electric charge quantities;

selecting a succession of balancing electric charge carrying components to approximate said charge samples with said electric charge carrying components being accompanied in the approximation by at least a single lesser magnitude companion component; and generating digital weights corresponding to each of said balancing electric charge carrying components.

13. The method according to claim 12 wherein said plurality of charge carrying components includes lesser magnitude charge carrying components having a cumulative magnitude defining an envelope exceeding the magnitude of minimal redundancy in representing particular charge values.

14. The method according to claim 13 wherein the charge carrying capacity of said companion components is less than an envelope defined by the excess of the cumulative magnitude of the lesser magnitude charge carrying components over a particular charge carrying component.

15. The method according to claim 12 wherein the charge carrying capacity of said companion components is approximately one half of an envelope defined by the excess of the cumulative magnitude of the lesser magnitude charge carrying components over a particular charge carrying component.

16. The method according to claim 12 wherein said at least a single lesser magnitude companion component includes first and second companion components.

17. The method according to claim 16 wherein said second companion component is at least an order of magnitude less than said first companion component.

18. The method according to claim 12 wherein said at least a single lesser magnitude companion component includes first, second, and third companion components.

19. A method of approximating a selected electrical charge quantity, including:

detecting a selected electrical charge quantity; and selecting an approximating set of electric charge carrying components for cancellation of said selected electrical charge quantity from a group of multi-valued valued electric charge carrying components comprising elements which enable redundant expression of particular values with two or more sets of the group, at least one component of said approximation set being a reduced magnitude companion component with respect to another component of said approximation set.

20. A circuit comprising:

a comparator having first and second comparator inputs of opposite polarity; and a plurality of electric charge carrying components selectably individually connectable to said first and second comparator inputs, said plurality including companion charge carrying components associated with larger magnitude corresponding ones of said plurality of electric charge carrying components.

21. The circuit according to claim 20 wherein said plurality includes electric charge carrying components having a charge carrying capacity which is redundant to the charge carrying capacity of a combination of other charge carrying components of said plurality.

22. The circuit according to claim 20 wherein the relative magnitude of the companion charge carrying components and the corresponding larger magnitude charge carrying components is predetermined.

23. The circuit according to claim 20 wherein the relative magnitude of the companion charge carrying components is a shift in variant function of the magnitude of the corresponding larger magnitude charge carrying components.

24. A method of successive approximation with a plurality of electrical components of magnitudes enabling redundant expression of electric charge values and including lesser magnitude companion components in said plurality, comprising:

sampling a selected electric value;

comparing electric signal values of particular ones of a plurality of electrical components and at least a single associated companion component as an approximation of the sampled electric signal; and generating statistically monotonic converging digital weights to approximate the sampled electrical value.

* * * * *